United States Patent
Jeong et al.

(10) Patent No.: US 8,949,584 B2
(45) Date of Patent: Feb. 3, 2015

(54) POWER ON RESET CIRCUIT

(75) Inventors: Ji-Yong Jeong, Seoul (KR); Seunghwan Baek, Hwaseong-si (KR); Soo-Ik Cha, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 700 days.

(21) Appl. No.: 13/239,066

(22) Filed: Sep. 21, 2011

(65) Prior Publication Data

US 2012/0117410 A1 May 10, 2012

(30) Foreign Application Priority Data

Nov. 8, 2010 (KR) .................. 10-2010-0110509

(51) Int. Cl.
*G06F 9/00* (2006.01)
*G06F 1/24* (2006.01)

(52) U.S. Cl.
CPC . *H03K 17/23* (2013.01); *G06F 1/24* (2013.01)
USPC .................................. 713/1; 713/2

(58) Field of Classification Search
None
See application file for complete search history.

(56) References Cited

U.S. PATENT DOCUMENTS

| 6,879,194 | B1* | 4/2005 | Caldwell | 327/143 |
| 7,667,506 | B2 | 2/2010 | Mawet | |
| 2004/0066218 | A1* | 4/2004 | Suzuki | 327/143 |
| 2005/0140406 | A1* | 6/2005 | Rizzo et al. | 327/143 |
| 2009/0322728 | A1 | 12/2009 | Lee et al. | |
| 2010/0156477 | A1* | 6/2010 | Chellappa | 327/143 |

FOREIGN PATENT DOCUMENTS

| JP | 2008-148024 A | 6/2008 |
| JP | 2008-252888 A | 10/2008 |
| KR | 10-2010-0001699 A | 1/2010 |

* cited by examiner

*Primary Examiner* — Paul Yanchus, III
(74) *Attorney, Agent, or Firm* — Lee & Morse, P.C.

(57) ABSTRACT

Embodiments may disclose a power on reset circuit, which includes: a current mirror connected to a power node, the power node receiving a variable power supply voltage, the current mirror being configured to supply a first current to a first line and a second current to a second line; a comparative voltage generator configured to generate a comparative voltage using the first current provided via the first line; a driver connected to the second line, the driver being configured to activate a reset signal in response to a voltage of the second line; and a ground selecting transistor configured to connect the second line and a ground node according to the comparative voltage.

16 Claims, 6 Drawing Sheets

Fig. 6

POWER ON RESET CIRCUIT

CROSS-REFERENCE TO RELATED APPLICATIONS

Korean Patent Application No. 10-2010-0110509, filed on Nov. 8, 2010, in the Korean Intellectual Property Office, and entitled: "Power On Reset Circuit," is incorporated by reference herein in its entirety.

BACKGROUND

1. Field

Exemplary embodiments relate to a semiconductor integrated circuit.

2. Description of the Related Art

A semiconductor integrated circuit may include a power on reset circuit to prevent a power-up malfunction.

SUMMARY

Embodiments may be directed to a semiconductor integrated circuit.

One embodiment may be directed to a power on reset circuit comprising a current mirror connected to a power node, the power node receiving a variable power supply voltage, the current mirror being configured to supply a first current to a first line and a second current to a second line; a comparative voltage generator configured to generate a comparative voltage using the first current provided via the first line; a driver connected to the second line, the driver being configured to activate a reset signal in response to a voltage of the second line; and a ground selecting transistor configured to connect the second line and a ground node according to the comparative voltage.

Another embodiment may be directed to a power on reset circuit which comprises a voltage level detecting part configured to receive a power supply voltage, the voltage level detecting part including a detection node having a voltage varied according to the power supply voltage; and a driver configured to output a reset signal when the voltage of the detection node is higher than a predetermined voltage. The voltage level detecting part includes a comparative voltage generator configured to generate a comparative voltage varied according to the power supply voltage; and a ground selecting transistor configured to connect the detection node and a ground node according to the comparative voltage.

Still another embodiment may be directed to a power on reset circuit comprising a power node receiving a power supply voltage; a current mirror connected to the power node and configured to supply a current to a first node and a second node; a first resistor having one end connected to the first node; a second resistor having one end connected to the other end of the first resistor and the other end grounded; a first transistor connected between the second node and a ground node and controlled by a voltage on a connection node of the other end of the first resistor and the one end of the second resistor; and a second transistor connected between the first node and the ground node and controlled by the voltage on the connection node.

BRIEF DESCRIPTION OF THE FIGURES

The above and other features will become more apparent to those of ordinary skill in the art by describing in detail exemplary embodiments with reference to the attached drawings, in which.

DETAILED DESCRIPTION

Example embodiments will now be described more fully hereinafter with reference to the accompanying drawings; however, they may be embodied in different forms and should not be construed as limited to the embodiments set forth herein.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of present embodiments.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on" or "connected to" another element or layer, it can be directly on or connected to the other element or layer, or intervening elements or layers may be present.

Figure 1:
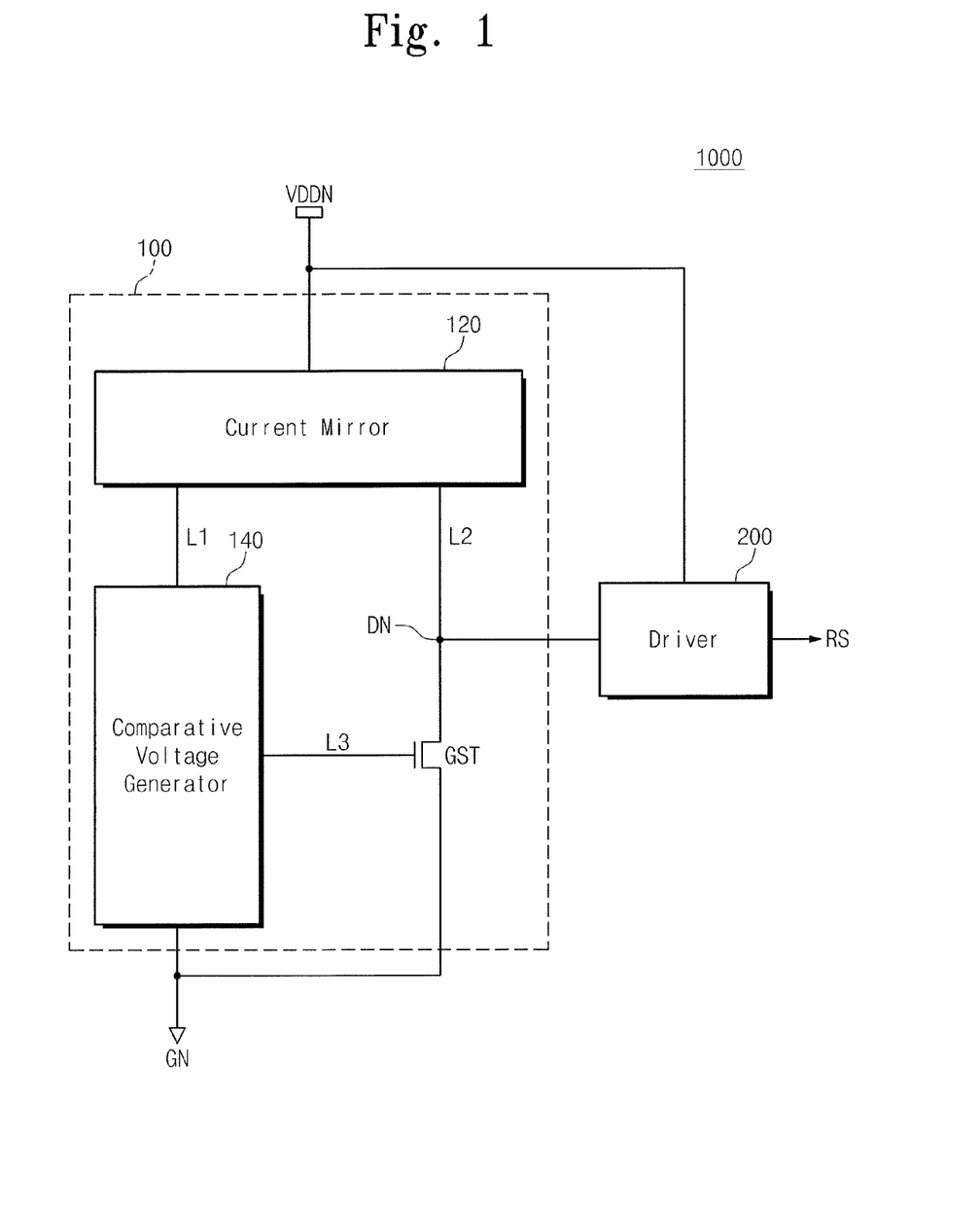
FIG. 1 illustrates a block diagram showing a power on reset circuit according to an exemplary embodiment.

FIG. 1 is a block diagram showing a power on reset circuit according to an exemplary embodiment. Referring to FIG. 1, a power on reset circuit according to an exemplary embodiment includes a voltage level detecting part 100 and a driver 200.

The voltage level detecting part 100 and the driver 200 are electrically connected to each other. The voltage level detecting part 100 and the driver 200 are connected with a power node VDDN receiving a power supply voltage. A level of the power supply voltage VDD may be varied. For example, when the power supply voltage is provided as an operating voltage of a semiconductor integrated circuit (not shown) including the power on reset circuit 1000, it may increase up to the operating voltage.

The driver 200 is electrically connected with the voltage level detecting part 100. The driver 200 activates or inactivates a reset signal RS according to whether an output voltage of the voltage level detecting part 100 is higher than a predetermined voltage. For example, the driver 200 activates the reset signal RS when an output voltage of the voltage level detecting part 100 is higher than a predetermined voltage.

The voltage level detecting part 100 includes a current mirror 120, a comparative voltage generator 140, a detection node DN, and a ground selecting transistor GST.

The current mirror 120 is connected with the power node VDDN. The current mirror 120 is connected to the comparative voltage generator 140 by a first line L1. The current mirror 120 is connected with the ground selecting transistor GST by a second line L2. The detection node DN is placed on the second line L2.

The current mirror 120 provides current to the comparative voltage generator 140 and the ground selecting transistor GST by the first and second lines L1 and L2, respectively. Current flowing by the first and second lines L1 and L2 may be changed according to a level of a power supply voltage.

The comparative voltage generator 140 is connected to the current mirror 120 by the first line L1. The comparative voltage generator 140 generates a comparative voltage using current provided by the first line L1. At this time, the comparative voltage may be changed according to the power supply voltage. The comparative voltage is provided to a gate of the ground selecting transistor GST by a third line L3.

The ground selecting transistor GST is connected to the current mirror 120 by the second line L2. The ground selecting transistor GST is connected with a ground node GN. The ground selecting transistor GST is connected to receive the comparative voltage by the third line L3. In other words, the ground selecting transistor GST is turned on or off according to the comparative voltage by the third line L3.

When the ground selecting transistor GST is turned off, a voltage level of the detection node DN may increase as current is provided by the second line L2. In other words, a voltage of the detection node DN increases according to charge inflow by the second line L2. At this time, a voltage of the detection node DN may vary according to a voltage level of the power node VDDN. The driver 200 connected with the detection node DN activates the reset signal RS when a voltage level of the detection node DN is higher than a predetermined voltage.

Where the ground selecting transistor GST is turned on, the ground selecting transistor GST forms a current path. The detection node DN is connected with the ground node GN by the transistor GST. Since charge on the detection node DN is discharged into the ground node GN, a voltage level of the detection node DN may decrease rapidly. The driver 200 inactivates when a voltage level of the detection node DN is lower than a predetermined voltage level.

The ground selecting transistor GST is turned on or off according to a level of the comparative voltage, and a voltage level of the detection node DN is adjusted. The reset signal RS is activated or inactivated according to a voltage level of the detection node DN.

Figure 2:
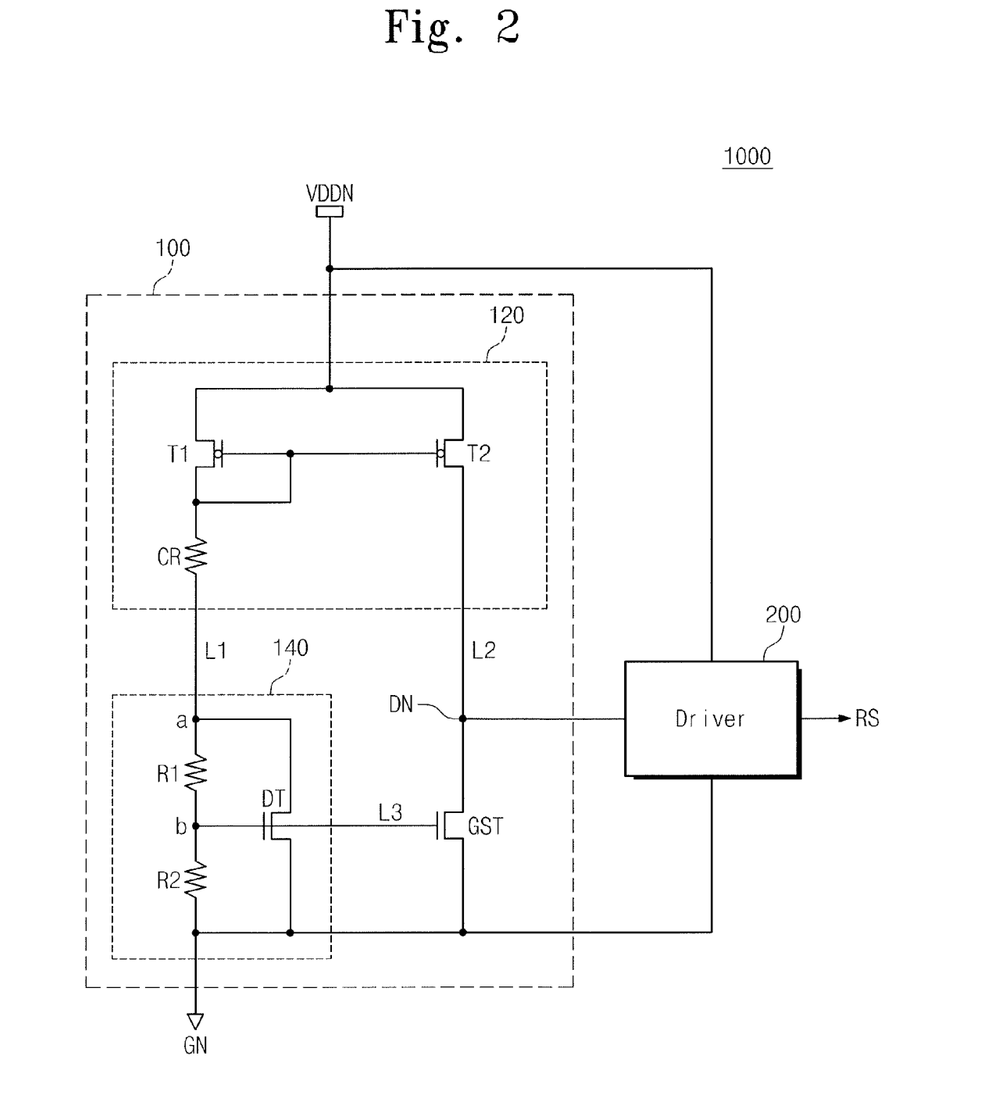
FIG. 2 illustrates a circuit diagram showing a power on reset circuit illustrated in FIG. 1.

FIG. 2 is a circuit diagram showing a power on reset circuit illustrated in FIG. 1. Referring to FIG. 2, a current mirror 120 includes first and second transistors T1 and T2 and a control resistor CR. At this time, the control resistor CR in FIG. 2 can be replaced with other impedance elements.

A source of the first transistor T1 is connected with a power node VDDN. A drain of the first transistor T1 is connected with the control resistor CR. The first transistor T1 has a gate connected with its drain. The control resistor CR is connected with a comparative voltage generator 140 by the first line L1.

A source of the second transistor T2 is connected with the power node VDDN. A drain of the second transistor T2 is connected with a detection node DN. Thus, a voltage level of the drain of the second transistor T2 is identical to that of the detection node DN. A gate of the second transistor T2 is connected with the gate of the first transistor T1.

With a circuit structure illustrated in FIG. 2, the current mirror 120 provides current to the comparative voltage generator 140 and a ground selecting transistor GST by the first and second lines L1 and L2, respectively. Current flowing by the first line L1 may vary according to a voltage level of the power node VDDN. The amount of current flowing by the first line L1 may be adjusted according to a value of the control resistor CR. The amount of current of the second line L2 may vary as the amount of current flowing by the first line L1 is varied. For example, current flowing by the first line L1 may be identical in amount to current flowing by the second line L2.

In FIG. 2, the first and second transistors T1 and T2 may be a p-type transistor. However, the first and second transistors T1 and T2 can be replaced with an n-type transistor.

The comparative voltage generator 140 includes first and second resistors R1 and R2, first and second nodes a and b, and detection transistor DT. The first node a is connected with the first line L1. The first resistor R1 is connected to the first node a and the second node b. The second resistor R2 is connected with the second node b and a ground node GN.

A drain of the detection transistor DT is connected with the first node a, and its source is grounded. Gates of the detection transistor DT and the ground selecting transistor GST are connected commonly to the second node b.

The detection transistor DT is turned on or off according to a voltage of the second node b. A voltage of the second node b is provided to the ground selecting transistor GST by a third line L3 as a comparative voltage. Thus, the ground selecting transistor GST is turned on or off according to a voltage level of the second node b.

Where the transistors DT and GST are turned off, voltage levels of the first and second nodes a and b may be determined according to a ratio of values of the first and second resistors R1 and R2. In an exemplary embodiment, voltage levels of the first and second nodes a and b may be expressed by the following equations.

$$Va \approx V_G \frac{R1 + R2}{CR + R1 + R2} \qquad \text{[Equation 1]}$$

$$Va \approx V_G \frac{R2}{CR + R1 + R2} \qquad \text{[Equation 2]}$$

Referring to the equations 1 and 2, $V_G$ indicates a gate voltage of the respective transistor T1 and T2, and Va and Vb indicates voltage levels of the first and second nodes a and b, respectively. With the above equations, voltages of the first and second nodes a and b may be determined according to the voltage division law. It is possible to calculate voltage levels of the first and second nodes a and b using the relationship among resistors R1 and R2 and current flowing by the first line L1.

The voltage $V_G$ may increase along with an increase in a voltage level of the power node VDDN. In an exemplary embodiment, the voltage $V_G$ may be calculated using a difference between a voltage level of the power node VDDN and a threshold voltage of the first or second transistor T1 or T2. The voltage $V_G$ increases as a voltage level of the power node VDDN increases. With the above equation 2, a voltage of the second node b increases according to an increase of the voltage VG.

It is assumed that the ground selecting transistor GST is at a turn-off state when the power supply voltage is applied to the power node VDDN. At this time, a voltage of the detection node DN increases. If a voltage level of the second node b reaches a threshold voltage of the ground selecting transistor GST, the ground selecting transistor GST is turned on. When the ground selecting transistor GST is turned on, a voltage of the detection node DN decreases rapidly.

In other words, whether or not the ground selecting transistor GST is turned-on may be determined according to a voltage (i.e., a comparative voltage) of the second node b. It is possible to control turn-on timing of the ground selecting transistor GST by changing values of the first and second resistors R1 and R2. A voltage level of the detection node DN is adjusted according to turn-on or turn-off of the ground selecting transistor GST.

A driver 200 may activate or inactivate a reset signal RS according to a voltage level of the detection node DN. Where a voltage level of the detection node DN is higher than a predetermined voltage level, the driver 200 activates the reset signal RS. Where a voltage level of the detection node DN is lower than a predetermined voltage level, the driver 200 inactivates the reset signal RS. In other words, where the ground selecting transistor GST is turned on according to an increase of the comparative voltage, the driver 200 inactivates the reset signal RS.

With exemplary embodiments, it is possible to control a division ratio of voltages applied to the first and second nodes a and b, by changing values of the control resistor CR and the first and second resistors R1 and R2. Thus, the voltage (i.e., the comparative voltage) of the second node b is adjusted by changing values of the control resistor CR and the first and second resistors R1 and R2. Activation and inactivation timing of the reset signal RS may be adjusted according to an adjusted voltage of the second node b.

In other words, it is possible to adjust the activation timing of the reset signal RS by changing values of the control resistor CR and the first and second resistors R1 and R2 according to the magnitude and variation of the power supply voltage applied to a power on reset circuit 1000.

In FIG. 2, the transistors DT and GST are illustrated to be an n-type transistor. However, it is well understood that the transistor DT and GST are formed of a p-type transistor.

In case of the power on reset circuit 1000 according to an exemplary embodiment, a voltage level of the detection node DN is changed according to variation of a voltage level of the power node VDDN by using four transistors T1, T2, DT, and GST. The reset signal RS is activated in response to a voltage of the detection node DN. Thus, it is possible to provide a power on reset circuit with reduced area.

Figure 3:
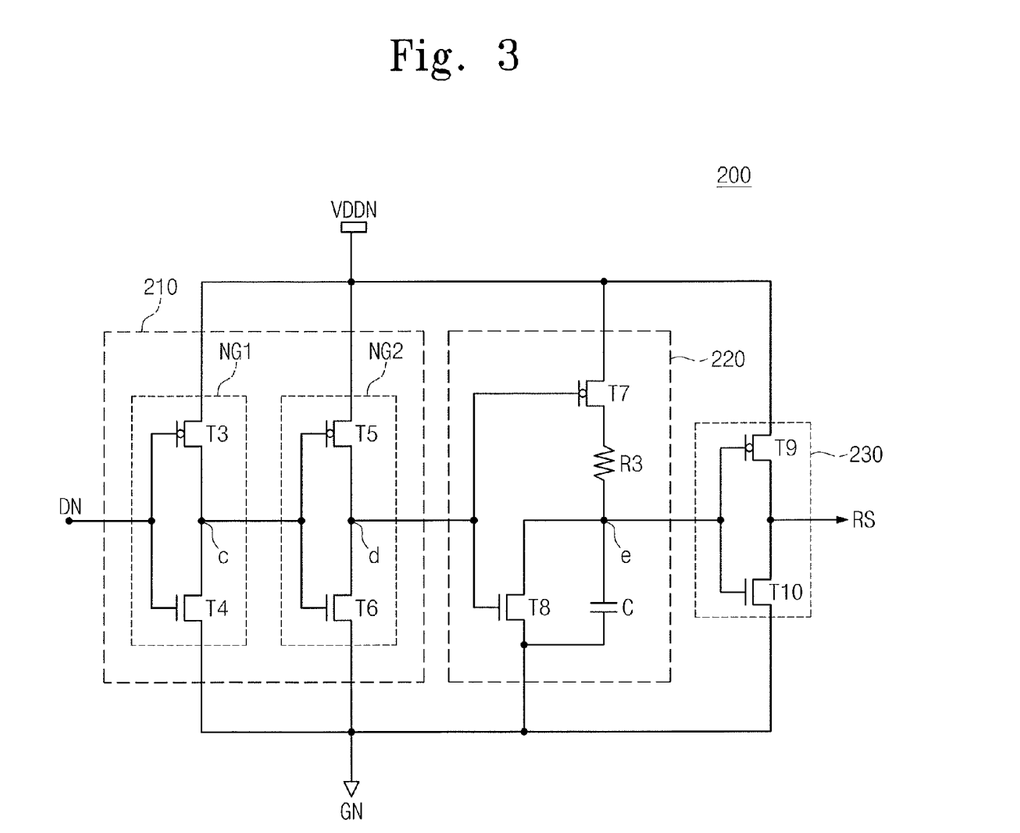
FIG. 3 illustrates a circuit diagram showing a driver illustrated in FIG. 2.

FIG. 3 is a circuit diagram showing a driver illustrated in FIG. 2. Referring to FIG. 3, a driver 200 includes a buffer 210, a delay 220, and an output inverter OI.

The buffer 210 may include at least one inverter. In FIG. 3, there is exemplarily illustrated an example that the buffer 210 is formed of two inverters NG1 and NG2. The inverters NG1 and NG2 include a p-type transistor and an n-type transistor, respectively.

An output node d of the buffer 210 is connected to a power node VDDN or a ground node GN according to a voltage of the detection node DN. Where a voltage level of the detection node DN is higher than a predetermined voltage, the output node d of the buffer 210 is connected to the power node VDDN. Where a voltage level of the detection node DN is lower than a predetermined voltage, the output node d of the buffer 210 is connected to the ground node GN.

For example, where a voltage level of the detection node DN is higher than a threshold voltage of a fourth transistor T4, an output node c of the inverter NG1 is connected to the ground node GN. At this time, the output node d of the buffer 210 is connected to the power node VDDN.

Where a voltage level of the detection node DN is lower than a threshold voltage of a third transistor T3, the output node c of the inverter NG1 is connected to the power node VDDN. At this time, the output node d of the buffer 210 is connected to the ground node GN.

The output node d of the buffer 210 is connected to the power node VDDN or the ground node GN according to whether a voltage level of the detection node DN reaches a predetermined level. Accordingly, as compared with the case that a reset signal RS is generated based on a voltage of the detection node DN, the reliability is improved when the reset signal RS is generated based on an output voltage of the buffer 210.

The delay 220 includes seventh and eighth transistors T7 and T8, a third resistor R3, and a capacitor C. The delay 220 is exemplarily illustrated to delay a voltage of an output node d of the buffer 210. But, a configuration of the delay 220 illustrated in FIG. 3 may be changed variously. For example, the delay 220 may be formed of a plurality of inverters for delaying a voltage of the output node d of the buffer 210.

An output node e of the delay 220 is connected to an input of the output inverter OI, which has an output configured to output the reset signal RS.

The delay 220 delays a voltage of the output node d such that a voltage transferred from the output node d is output after a predetermined time lapses. For example, where the output node d of the buffer 210 is connected with the ground node GN, the seventh transistor T7 is turned on and the eighth transistor T8 is turned off. A voltage level of the output node e of the delay 220 may increase by the capacitor C. Where the output node d of the buffer 210 is connected with the power node VDDN, the seventh transistor T7 is turned off and the eighth transistor T8 is turned on. A voltage level of the output node e of the delay 220 may decrease by the capacitor C.

The output inverter OI activates or inactivates the reset signal RS according to a voltage level of the output node e of the delay 220. The output inverter OI includes ninth and tenth transistors T9 and T10. The ninth and tenth transistors T9 and T10 are turned on or off according to a voltage level of the output node e.

When a voltage level of the output node e reaches a threshold voltage of the ninth transistor T9, a high-level reset signal RS is output. Thus, the reset signal RS is activated. On the other hand, when a voltage level of the output node e reaches a threshold voltage of the tenth transistor T10, a low-level reset signal RS is output. Thus, the reset signal RS is inactivated.

As a result, where a voltage of the detection node DN is higher than a predetermined voltage (for example, a threshold voltage of the fourth transistor T4), a high-level reset signal RS is generated. On the other hand, where a voltage of the detection node DN is lower than a predetermined voltage, a low-level reset signal RS is generated.

The driver 200 according to an exemplary embodiment activates the reset signal RS after a voltage level of the detection node DN is judged to be higher than a predetermined voltage and a time lapses. It is possible to generate the reset signal RS after stabilization of a power supply voltage by delaying a voltage level of the detection node DN by the delay 220 of the driver 200. Accordingly, it is possible to provide the power on reset circuit 1000 with improved reliability.

Figure 4:
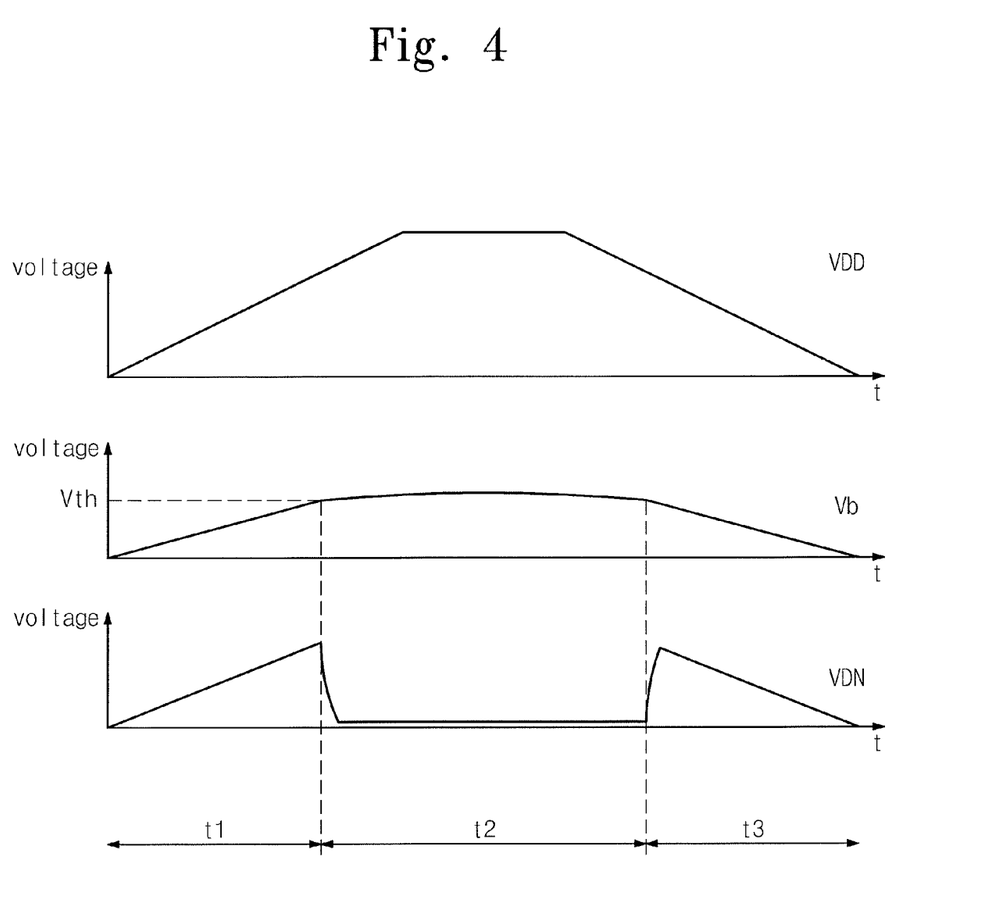
FIG. 4 illustrates a diagram showing voltage variation of internal nodes when a power supply voltage is changed.

FIG. 4 is a diagram showing voltage variation of internal nodes when a power supply voltage is changed. It is assumed that a threshold voltage of a detection transistor DT is identical to that of a ground selecting transistor GST.

Referring to FIGS. 2 and 4, in a first time period t1, a voltage VDN of a detection node DN increases along with an increase in a voltage VDD of a power node VDDN. In particular, in the first time period t1, the ground selecting transistor GST is at a turn-off state. Accordingly, charge transferred to the detection node DN is accumulated, and a voltage VDN of the detection node DN increases. A driver 200 activates a reset signal RS in response to the voltage VDN of the detection node DN.

In the first time period t1, the detection transistor DT is at a turn-off state. As a voltage VDD of the power node VDDN increases, a voltage Vb of a second node b increases together.

In a second time period t2, the detection transistor DT is turned on if the voltage Vb of the second node b reaches a threshold voltage Vth of the detection transistor DT. The second node b may have a threshold voltage Vth of the detection transistor DT in level.

Further, the ground selecting transistor GST is turned on when a voltage level Vb of the second node b reaches a threshold voltage of the ground selecting transistor GST. If the ground selecting transistor GST is turned on, charge accumulated on the detection node DN is discharged rapidly to a ground node GN. A voltage VDN of the detection node DN may be reduced rapidly. At this time, the driver 200 inactivates the reset signal RS in response to the voltage VDN of the detection node DN.

In a third time period t2, the detection transistor DT is turned off as a voltage VDD of the power node VDDN decreases. A voltage Vb of the second node b may be proportional to the voltage VDD of the power node VDDN according to the voltage division law.

The ground selecting transistor GST is again turned off if the voltage Vb of the second node b decreases up to a threshold voltage of the ground selecting transistor GST. The voltage VDN of the detection node DN increases sharply and then decreases along with the voltage VDD of the power node VDDN. At this time, the driver 200 activates the reset signal RS in response to the voltage VDN of the detection node DN.

Figure 5:
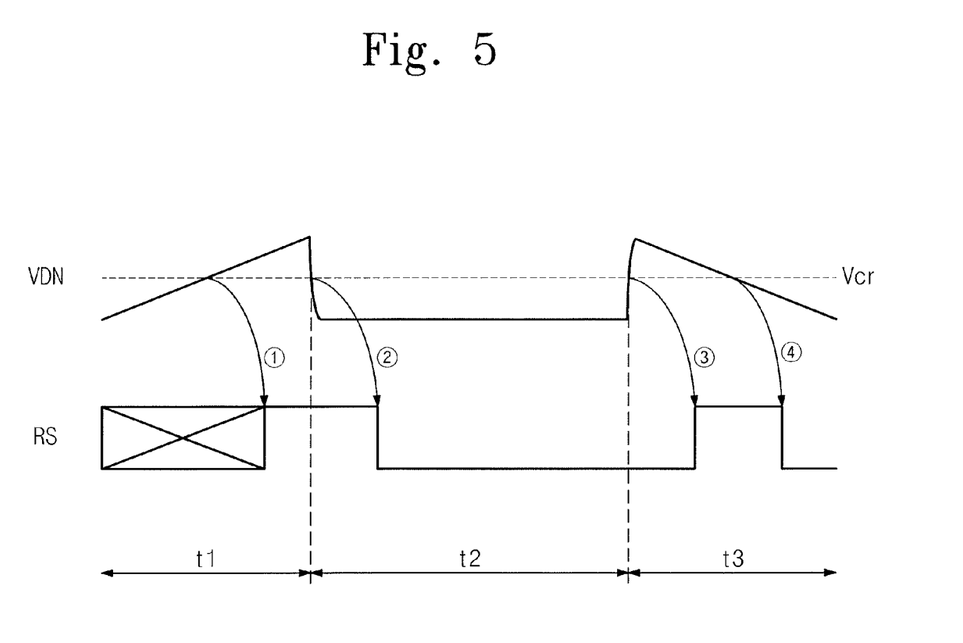
FIG. 5 illustrates a diagram showing variation of a reset signal according to variation of an input voltage of a driver illustrated in FIG. 3.

FIG. 5 is a diagram showing variation of a reset signal according to variation of an input voltage of a driver illustrated in FIG. 3. Referring to FIGS. 2 and 5, a reset signal RS is activated responsive to a voltage VDN of a detection node DN.

In a first time period t1, if the voltage VDN of the detection node DN reaches a critical voltage Vcr, the reset signal RS is activated after a predetermined time (①). In an exemplary embodiment, the critical voltage Vcr may be determined according to threshold voltages of transistors T3 and T4 (refer to FIG. 3) within a driver 200. In FIG. 5, it is exemplarily illustrated that a high-level reset signal RS is generated when the reset signal RS is activated.

In a second time period t2, the voltage VDN of the detection node DN decreases sharply. If the voltage VDN of the detection node DN decreases up to the critical voltage Vcr, the driver 200 inactivates the reset signal RS after a time lapses (②). In FIG. 5, it is exemplarily illustrated that a low-level reset signal RS is generated when the reset signal RS is inactivated.

If the voltage VDN of the detection node DN is higher than the critical voltage Vcr, the driver 200 activates the reset signal RS after a time lapses (③).

Likewise, if the voltage VDN of the detection node DN is higher or lower than the critical voltage Vcr, the driver 200 activates the reset signal RS after a time lapses (④).

In FIG. 5, there is exemplarily illustrated that the reset signal RS is activated high and inactivated low. However, activation and inactivation logical states of the reset signal RS may be changed by replacing an output inverter OI in FIG. 3 with other units.

Figure 6:
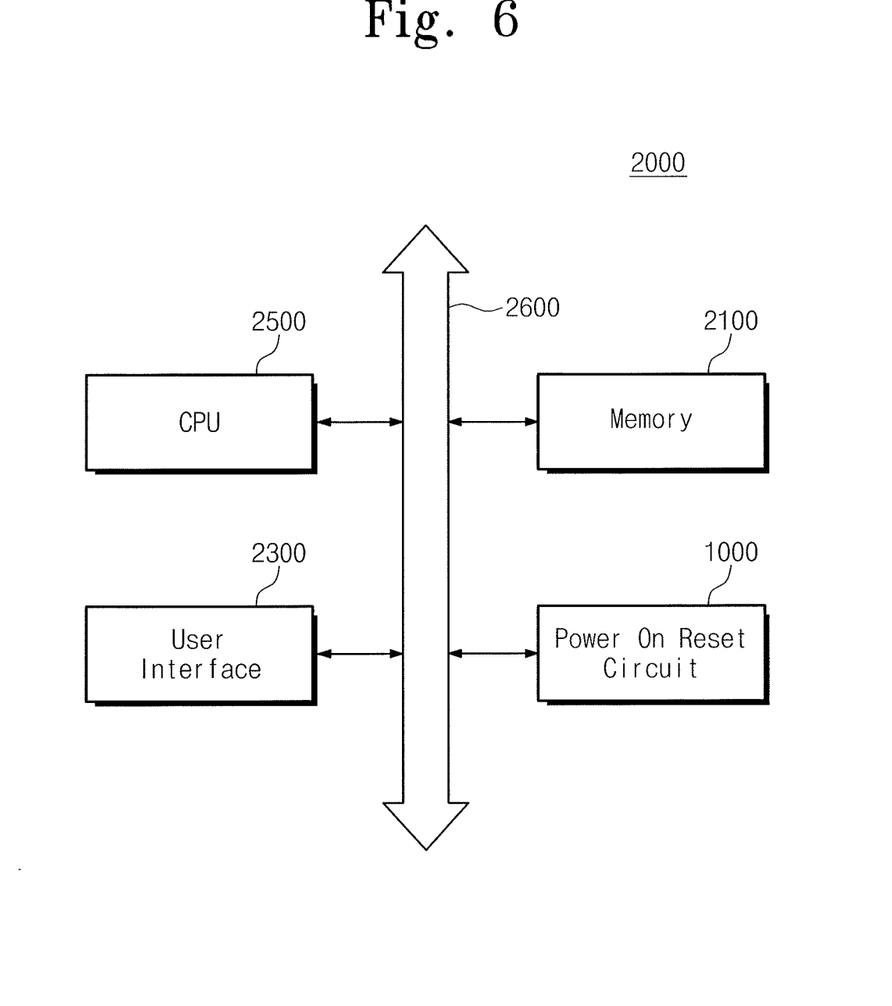
FIG. 6 illustrates a block diagram showing a computing system including a power on reset circuit according to an exemplary embodiment.

FIG. 6 is a block diagram showing a computing system including a power on reset circuit according to an exemplary embodiment. Referring to FIG. 6, a power on reset circuit 1000 is installed with an information processing system, i.e., a mobile device, a desktop computer, etc.

A computing system 2000 according to an exemplary embodiment includes the power on reset circuit 1000 for controlling a reset operation of a memory 2100 and the computing system 2000. The computing system 2000 further includes a user interface 2300 and CPU 2500 which are electrically connected with a bus 2600.

The power on reset circuit 1000 is connected with the memory 2100, the user interface 2300 and the CPU 2500 by the bus 2600. The power on reset circuit 1000 provides a reset signal.

The memory 2100 is configured to be substantially identical to a memory card or a solid state disk (SSD). The memory 2100 may include a memory cell array (not shown) and a controller (not shown) for controlling the memory cell array.

The memory 2100 is classified into non-volatile memory and volatile memory. Volatile memory is memory which loses data stored therein at power-off. Volatile memory may include SRAM, DRAM, SDRAM, etc. Non-volatile memory is memory which retains data stored therein even at power-off. Non-volatile memory may include read only memory (ROM), programmable ROM (PROM, electrically programmable ROM (EPROM), electrically erasable and programmable ROM (EEPROM), flash memory, phase-change RAM (PRAM), magnetic RAM (MRAM), resistive RAM (RRAM), ferroelectric RAM (FRAM), etc. The memory 2100 illustrated in FIG. 6 includes a combination of at least two ones of the above-described memories.

The memory 2100 may be packed by various packages such as PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), etc.

Data provided by the user interface 2300 or processed by the CPU 2500 is stored in the memory 2100. Although not shown in FIG. 6, the computing system may further include an application chipset, a camera image processor (CIS), a modem, a mobile DRAM, etc.

In some embodiments, the computing system 2000 may be used as computer, portable computer, Ultra Mobile PC (UMPC), workstation, net-book, PDA, web tablet, wireless phone, mobile phone, smart phone, e-book, PMP (portable multimedia player), digital camera, digital audio recorder/player, digital picture/video recorder/player, e-book, portable game machine, navigation system, black box, digital camera, digital multimedia broadcasting (DMB) player, 3-dimensional television, a device capable of transmitting and receiving information at a wireless circumstance, one of various electronic devices constituting home network, one of various electronic devices constituting computer network, one of various electronic devices constituting telematics network, RFID, or one of various electronic devices constituting computing system.

The power on reset circuit 1000 according to an exemplary embodiment adjusts a voltage level of a detection node DN transistors and resistors. A reset signal RS is activated responsive to a voltage of the detection node DN. It is possible to provide a power on reset circuit with reduced area.

With exemplary embodiments, it is possible to adjust a comparative voltage changed according to a power supply voltage by changing resistor values within the power on reset circuit 1000. In other words, it is possible to adjust the activation timing of a reset signal RS according to the magnitude and variation of the power supply voltage applied to a power on reset circuit 1000. Accordingly, it is possible to provide a power on reset circuit with the improved reliability.

By way of summation and review, recently there have been increased electronic devices operating at low power supply voltage, i.e., portable personal computers, net-books, personal digital assistant (PDA), portable computers, web tablets, smart phones, portable multimedia player (PMP), portable game machines, etc. This trend requires a semiconductor integrated circuit with a power on reset circuit operating at a low power supply voltage. At power up in the semiconductor integrated circuit, when the power supply voltage reaches a predetermined voltage level, the power on reset circuit provides a reset signal to initialize flip-flops, latches, registers, and the line. At power up, the reset signal is activated when the power supply voltage reaches the predetermined voltage level and inactivated when the power supply voltage reaches a normal operating voltage level. Internal elements of the semiconductor integrated circuit are reset to an initial state according to the activated reset signal.

Exemplary embodiments may be directed to a power on reset circuit providing a reset signal when a semiconductor integrated circuit is powered up. According to an exemplary embodiment, the power on reset circuit adjusts a voltage level of a detection node DN using less transistors and resistors. A reset signal RS is activated in response to the voltage of the detection node DN. Thus, in exemplary embodiments, it is possible to provide a power on reset circuit operating at a low power supply voltage with reduced area.

Exemplary embodiments have been disclosed herein, and although specific terms are employed, they are used and are to be interpreted in a generic and descriptive sense only and not for purpose of limitation.

What is claimed is:

1. A power on reset circuit, comprising:
a current mirror connected to a power node, the power node receiving a variable power supply voltage, the current mirror to supply a first current to a first line and a second current to a second line;
a comparative voltage generator to generate a comparative voltage using the first current provided via the first line;
a driver connected to the second line, the driver to activate a reset signal in response to a voltage of the second line; and
a ground selecting transistor to connect the second line and a ground node according to the comparative voltage, wherein the comparative voltage generator includes:
a first impedance element connected to the first line and a second impedance element connected between the first impedance element and the ground node, wherein a node voltage of a node between the first and second impedance elements is provided as the comparative voltage, and
a detection transistor having a gate connected with the node formed between the first and second impedance elements, a first end of the detection transistor connected with a first node formed between the first line and the first impedance element and a second end of the detection transistor connected with the ground node.

2. The power on reset circuit as claimed in claim 1, wherein the voltage of the second line increases according to an increase of the variable power supply voltage and decreases according to a turn-on operation of the ground selecting transistor.

3. The power on reset circuit as claimed in claim 1, wherein the driver activates the reset signal when the voltage of the second line is higher than a predetermined voltage and inactivates the reset signal when the voltage of the second line is lower than the predetermined voltage.

4. The power on reset circuit as claimed in claim 3, wherein the driver activates the reset signal after the voltage of the second line becomes higher than the predetermined voltage and a period of time lapses.

5. The power on reset circuit as claimed in claim 1, wherein a first value of the first current provided via the first line varies according to the variable power supply voltage and a second value of the second current provided via the second line is determined according to the first value of the first current provided via the first line.

6. A power on reset circuit, comprising:
a voltage level detecting part to receive a power supply voltage, the voltage level detecting part including a detection node having a voltage varied according to the power supply voltage; and
a driver to output a reset signal when the voltage of the detection node is higher than a predetermined voltage,
wherein the voltage level detecting part includes:
a comparative voltage generator to generate a comparative voltage varied according to the power supply voltage; and
a ground selecting transistor to connect the detection node and a ground node according to the comparative voltage, wherein the voltage level detecting part includes a current mirror which includes:
a first transistor having a first end connected to receive the power supply voltage;
a second transistor having a first end connected to receive the power supply voltage; and
a control impedance element connected to a second end of the first transistor and the comparative voltage generator, wherein gates of the first and second transistors are connected to each other, the gate of the first transistor connected with the second end of the first transistor and a second end of the second transistor connected with the detection node.

7. The power on reset circuit as claimed in claim 6, wherein the ground selecting transistor is connected between the detection node and the ground node and has a gate connected to receive the comparative voltage, and whether or not the ground selecting transistor is turned-on is determined according to the comparative voltage.

8. The power on reset circuit as claimed in claim 6, wherein the current mirror generates a first current and a second current using the power supply voltage, the first current being provided to the comparative voltage generator and the second current being provided to the detection node.

9. The power on reset circuit as claimed in claim 8, wherein a first amount of the first current is varied according to the power supply voltage and a second amount of the second current is varied according to the first amount of the first current.

10. The power on reset circuit as claimed in claim 8, wherein the comparative voltage generator generates the comparative voltage using the first current.

11. The power on reset circuit as claimed in claim 8, wherein, when the ground selecting transistor is turned off, the voltage of the detection node increases as the second current is provided.

12. The power on reset circuit as claimed in claim 6, wherein the comparative voltage generator includes:
- a first impedance element connected with the control impedance element;
- a second impedance element between the first impedance element and the ground node; and
- a detection transistor having a gate connected to a node formed between the first and second impedance elements, wherein a first end of the detection transistor is connected with a first node formed between the control impedance element and the first impedance element, and a second end of the detection transistor is connected with the ground node, a node voltage of the node formed between the first and second impedance elements being provided as the comparative voltage.

13. A computing system, comprising:
- a memory;
- a user interface;
- a central processing unit;
- a power on reset circuit providing a reset signal for controlling a reset operation of the memory, the power on reset circuit including:
  - a voltage level detecting part to receive a power supply voltage, the voltage level detecting part including a detection node having a voltage varied according to the power supply voltage; and
  - a driver being to output the reset signal when the voltage of the detection node is higher than a predetermined voltage, the voltage level detecting part including:
    - a comparative voltage generator to generate a comparative voltage varied according to the power supply voltage; and
    - a ground selecting transistor being configured to connect the detection node and a ground node according to the comparative voltage; and
- a bus which is electrically connected to the memory, the user interface, the central processing unit, and the power on reset circuit, wherein the current mirror includes:
  - a first transistor having a first end connected to receive the power supply voltage;
  - a second transistor having a first end connected to receive the power supply voltage; and
  - a control impedance element connected to a second end of the first transistor and the comparative voltage generator, wherein gates of the first and second transistors are connected to each other, the gate of the first transistor connected with the second end of the first transistor, and a second end of the second transistor connected with the detection node.

14. The computing system as claimed in claim 13, wherein the current mirror generates a first current and a second current using the power supply voltage, the first current being provided to the comparative voltage generator and the second current being provided to the detection node.

15. The computing system as claimed in claim 14, wherein the ground selecting transistor is connected between the detection node and the ground node and has a gate connected to receive the comparative voltage, and whether or not the ground selecting transistor is turned-on is determined according to the comparative voltage.

16. The computing system as claimed in claim 13, wherein the comparative voltage generator includes:
- a first impedance element connected with the control impedance element;
- a second impedance element between the first impedance element and the ground node; and
- a detection transistor having a gate connected to a node formed between the first and second impedance elements, wherein a first end of the detection transistor is connected with a first node formed between the control impedance element and the first impedance element, and a second end of the detection transistor is connected with the ground node, a node voltage of the node formed between the first and second impedance elements being provided as the comparative voltage.

\* \* \* \* \*